(12) United States Patent
Otremba

(10) Patent No.: US 12,463,173 B2
(45) Date of Patent: Nov. 4, 2025

(54) MULTI-CHIP DEVICE WITH GATE REDISTRIBUTION STRUCTURE

(71) Applicant: Infineon Technologies Austria AG, Villach (AT)

(72) Inventor: Ralf Otremba, Kaufbeuren (DE)

(73) Assignee: Infineon Technologies Austria AG, Villach (AT)

(*) Notice: Subject to any disclaimer, the term of this patent is extended or adjusted under 35 U.S.C. 154(b) by 405 days.

(21) Appl. No.: 18/130,552

(22) Filed: Apr. 4, 2023

(65) Prior Publication Data
US 2023/0335530 A1    Oct. 19, 2023

(30) Foreign Application Priority Data
Apr. 13, 2022  (EP) .................................... 22168135

(51) Int. Cl.
*H01L 23/00* (2006.01)
*H01L 23/495* (2006.01)
*H01L 25/07* (2006.01)

(52) U.S. Cl.
CPC ........ *H01L 24/49* (2013.01); *H01L 23/49575* (2013.01); *H01L 24/06* (2013.01);
(Continued)

(58) Field of Classification Search
CPC ... H01L 24/49; H01L 23/49575; H01L 24/06; H01L 24/45; H01L 24/48; H01L 24/73; H01L 25/072; H01L 23/49513; H01L 24/32; H01L 24/37; H01L 24/40; H01L 2224/0603; H01L 2224/06181; H01L 2224/32245; H01L 2224/37005; H01L 2224/37147; H01L 2224/40137; H01L 2224/40245; H01L 2224/45015; H01L 2224/45124; H01L 2224/45147; H01L 2224/48011; H01L 2224/48137; H01L 2224/48245; H01L 2224/4903;
(Continued)

(56) References Cited

U.S. PATENT DOCUMENTS

2006/0022298 A1  2/2006  Shiraishi et al.
2020/0185359 A1  6/2020  Nakashima et al.

FOREIGN PATENT DOCUMENTS

CN   201804864 U   4/2011
EP   3002784 A1    4/2016
(Continued)

*Primary Examiner* — Elias Ullah
(74) *Attorney, Agent, or Firm* — Murphy, Bilak & Homiller, PLLC

(57) ABSTRACT

A power device package includes first and second power transistor chips each having a control electrode, a first load electrode and a second load electrode. A control package terminal is electrically coupled to the control electrode of the first power transistor chip via a first wire bond connection and to the control electrode of the second power transistor chip via a second wire bond connection. A first package terminal is electrically coupled to the first load electrode of the first and second power transistor chips. A second package terminal is electrically coupled to the second load electrode of the first power transistor chip and/or the second power transistor chip. A length of the first wire bond connection is greater than a length of the second wire bond connection, and a cross-sectional area of the first wire bond connection is greater than a cross-sectional area of the second wire bond connection.

14 Claims, 4 Drawing Sheets

(52) U.S. Cl.
CPC ............ *H01L 24/45* (2013.01); *H01L 24/48* (2013.01); *H01L 24/73* (2013.01); *H01L 25/072* (2013.01); *H01L 23/49513* (2013.01); *H01L 24/32* (2013.01); *H01L 24/37* (2013.01); *H01L 24/40* (2013.01); *H01L 2224/0603* (2013.01); *H01L 2224/06181* (2013.01); *H01L 2224/32245* (2013.01); *H01L 2224/37005* (2013.01); *H01L 2224/37147* (2013.01); *H01L 2224/40137* (2013.01); *H01L 2224/40245* (2013.01); *H01L 2224/45015* (2013.01); *H01L 2224/45124* (2013.01); *H01L 2224/45147* (2013.01); *H01L 2224/48011* (2013.01); *H01L 2224/48137* (2013.01); *H01L 2224/48245* (2013.01); *H01L 2224/4903* (2013.01); *H01L 2224/73221* (2013.01); *H01L 2224/73265* (2013.01); *H01L 2924/10253* (2013.01); *H01L 2924/10272* (2013.01); *H01L 2924/13055* (2013.01); *H01L 2924/13091* (2013.01); *H01L 2924/20658* (2013.01); *H01L 2924/20755* (2013.01); *H01L 2924/20756* (2013.01); *H01L 2924/20757* (2013.01); *H01L 2924/2076* (2013.01)

(58) Field of Classification Search
CPC . H01L 2224/73221; H01L 2224/73265; H01L 2924/10253; H01L 2924/10272; H01L 2924/13055; H01L 2924/13091; H01L 2924/20658; H01L 2924/20755; H01L 2924/20756; H01L 2924/20757; H01L 2924/2076; H01L 23/49524; H01L 23/4952; H01L 23/49562; H01L 2224/40139; H01L 2224/48139; H01L 2224/49113; H01L 2224/49175; H01L 2224/49505; H01L 2224/73271; H01L 2224/83801; H01L 2224/8382; H01L 2224/8384; H01L 2924/181
See application file for complete search history.

(56) References Cited

FOREIGN PATENT DOCUMENTS

| | | |
|---|---|---|
| JP | 2005129826 A | 5/2005 |
| TW | M456043 U | 6/2013 |

MULTI-CHIP DEVICE WITH GATE REDISTRIBUTION STRUCTURE

TECHNICAL FIELD

This disclosure relates generally to the technique of semiconductor packaging, and in particular to a power device package including a plurality of parallelized power transistors.

BACKGROUND

Power transistor device packages are widely used as electronic switches in a variety of electronic circuits. Higher efficiency, increased power density, improved thermal behavior, lower switching losses and lower cost are among the key goals for next generation power device package design.

A conventional approach is to include one or a plurality of power transistor chips in power modules. In power modules, the one or more power transistor chips are mounted on an insulating chip carrier (for example ceramic-based carrier), which provides the chip wiring and the electrical insulation to the heat sink. While this approach offers the customer the highest possible performance (since the ceramic carrier meets the maximum insulation requirements while providing high design flexibility for chip wiring through conductive traces on the insulating chip carrier), it is expensive.

SUMMARY

According to an aspect of the disclosure a power device package comprises a first power transistor chip having a control electrode, a first load electrode and a second load electrode. The power device package further comprises a second power transistor chip having a control electrode, a first load electrode and a second load electrode. A control package terminal is electrically coupled to the control electrode of the first power transistor chip via a first wire bond connection and to the control electrode of the second power transistor chip via a second wire bond connection. A first package terminal is electrically coupled to the first load electrodes of the first power transistor chip and the second power transistor chip. A second package terminal is electrically coupled to one or more of the second load electrodes of the first power transistor chip and/or the second power transistor chip. A length of the first wire bond connection is greater than a length of the second wire bond connection, and a cross-sectional area of the first wire bond connection is greater than a cross-sectional area of the second wire bond connection.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "electrically connected" or "electrically coupled" or similar terms are not meant to mean that the elements are directly contacted together; intervening elements may be provided between the "electrically connected" or "electrically coupled" elements, respectively. However, in accordance with the disclosure, the above-mentioned and similar terms may, optionally, also have the specific meaning that the elements are directly contacted together, i.e. that no intervening elements are provided between the "electrically connected" or "electrically coupled" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
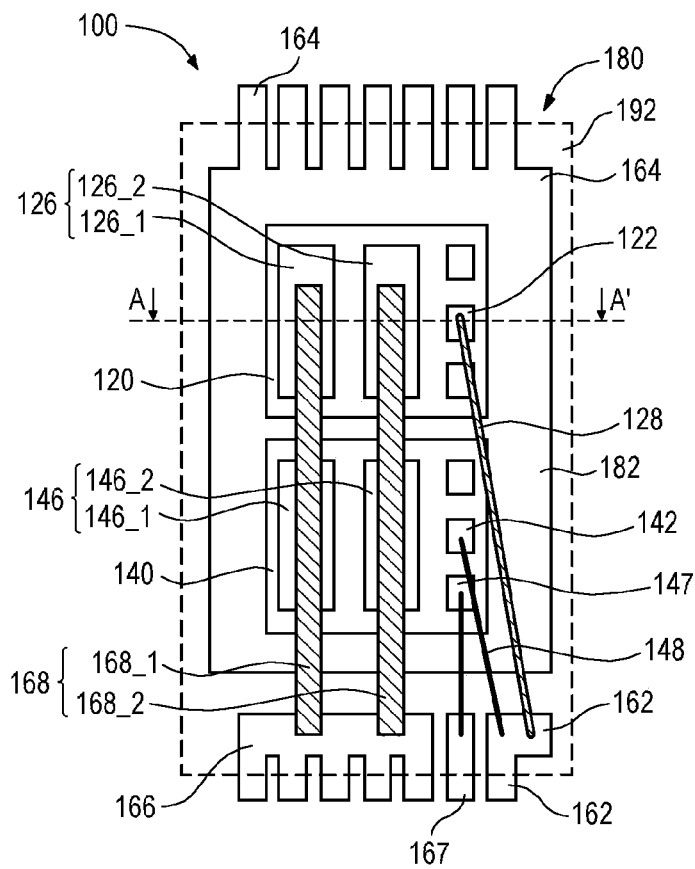
FIG. 1 is a schematic top view of an example of a power device package including two power transistor chips.
Figure 2:
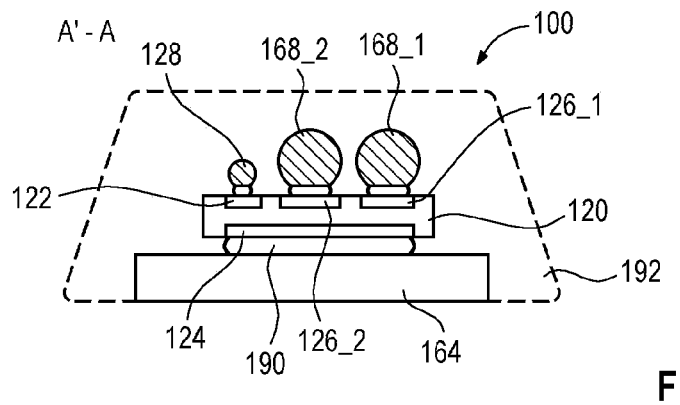
FIG. 2 is a schematic cross-sectional view of the power device package of FIG. 1 along line A-A'.

Referring to FIGS. 1 and 2, a power device package 100 includes a first power transistor chip 120 and a second power transistor chip 140. The first power transistor chip 120 has a control electrode 122, a first load electrode 124 and a second load electrode 126. For example, the second load electrode 126 may be divided into a plurality of second load electrode sections 126_1, 126_2.

The second power transistor chip 140 has a control electrode 142, a first load electrode (not shown) and a second load electrode 146. Similar as in the first power transistor chip 120, the second load electrode 146 may, e.g., be divided into a plurality of second load electrode sections 146_1, 146_2.

The power device package 100 further includes a control package terminal 162, a first package terminal 164 and a second package terminal 166. All package terminals 162, 164, 166 are configured to electrically connect the power device package 100 to external circuitry such as, e.g., an application board (not shown).

The control package terminal 162 is electrically coupled to the control electrode 122 of the first power transistor chip 120 via a first wire bond connection 128. Further, the control package terminal 162 is electrically coupled to the control electrode 142 of the second power transistor chip 140 via a second wire bond connection 148.

The first package terminal 164 is electrically coupled to the first load electrode 124 of the first power transistor chip 120 and to the first load electrode (not shown) of the second power transistor chip 140. That is, the load electrodes of the power transistor chips 120, 140 are connected in parallel through the first package terminal 164.

The second package terminal 166 is coupled to e.g. the second load electrode 126 of the first power transistor chip 120. The second package terminal 166 may additionally be coupled to the second electrode 146 (e.g. to one or more sections 146_1, 146_2 thereof). However, it is also possible that the second load electrode 126 (e.g. one or more sections 126_1, 126_2 thereof) is coupled to the second package terminal 166 while the second load electrode 146 (e.g. one or more sections 146_1, 146_2 thereof) is coupled to another package terminal not shown in FIG. 1.

In other words, while the first load electrodes of the power transistor chips 120, 140 are connected to a common first package terminal 164, the second load electrodes 126, 146 (or sections 126_1, 126_2, 146_1, 146_2 thereof) may either be coupled to a common second package terminal 166 (as depicted in FIG. 1) or may each be coupled to a distinct second package terminal. Such two distinct second package terminals may, e.g., be designed by dividing the (common) second package terminal 166 into two terminals, with one of these second package terminals being electrically coupled to the second load electrode 126 of the first power transistor chip 120 and the other second package terminal being electrically coupled to the second load electrode 146 of the second power transistor chip 140.

In the exemplary power package 100 shown in FIG. 1, the second load electrode 126 of the first power transistor chip 120 and the second load electrode 146 of the second power transistor chip 140 are connected to the second package terminal 166 via a power conductor 168. For example, the power conductor 168 may be composed of a plurality of power conductor elements 168_1, 168_2, wherein the power conductor element 168_1 connects the second load electrode sections 126_1, 146_1 to the second package terminal 166 and the power conductor element 168_2 connects the second load electrode sections 126_2 and 146_2 to the second package terminal 166.

The first power transistor chip 120 and the second power transistor chip 140 are mounted on a carrier 180. The carrier 180 may, e.g., be a leadframe. In the following disclosure, without loss generality, the carrier 180 is exemplified by a leadframe 180.

The leadframe 180 may include a common chip pad 182. The first power transistor chip 120 and the second power transistor chip 140 may, e.g. be mounted on the common chip pad 182. More specifically, the first load electrode 124 of the first power transistor chip 120 and the first load electrode of the second power transistor chip 140 may be directly bonded to the common chip pad 182 by die bonding.

For example, die bonding may be carried out by diffusion soldering. In other examples, the power transistor chips 120, 140 may be mounted to the common chip pad 182 by soft solder or a bonding paste or an electrically conductive adhesive or a sinter bond. These bond materials are indicated in FIG. 2 by reference sign 190.

The control package terminal 166 may be a lead of the leadframe 180. Further, the control package terminal 162 may be a lead of the leadframe 180. The first package terminal 164 may either be formed by leads of the leadframe projecting from the common chip pad 182 or may be formed by a bottom surface of the common chip pad 182 allowing the power device package 100 to be surface-mounted on an application board (not shown) and/or on a heat sink (not shown).

The power transistor chips 120, 140 may optionally include further electrodes, e.g. a sense electrode 147. Further, the power device package 100 may include further package terminals, e.g. a Calvin sense terminal 167. The Calvin sense terminal 167 may also be formed by a lead of the leadframe 180.

The first power transistor chip 120 and the second power transistor chip 140 may be MOSFETs (Metal Oxide Semi-conductor Field Effect Transistors). In particular, they may be superjunction Si-MOSFETs or SiC-MOSFETs. In other examples, the first power transistor chip 120 and the second power transistor chip 140 may be IGBTs (Insulated Gate Bipolar Transistors).

The power transistor chips 120, 140 may have a vertical structure, i.e. the electrical load current may flow in a direction perpendicular to the main surfaces of the power transistor chips 120, 140.

By way of example and without loss of generality, the first load electrodes 124 may be the drain electrodes (or collector electrodes in case of an IGBT) of the power transistor chips 120, 140. The second load electrodes 126, 146 may be the source electrodes (or emitter electrodes in case of an IGBT) of the power transistor chips 120, 140. The control electrodes 122, 142 may be the gate electrodes of the power transistor chips 120, 140.

The first and second power transistor chips 120, 140 (and, e.g., all power transistor chips of the power device package 100) may have the same specifications. For example, the power device package 100 may include only power transistor chips 120, 140 of identical specifications.

Further, the first power transistor chip 120 and the second power transistor chip 140 (and, e.g., all power transistor chips of the power device package 100) may be from the same wafer. In this case, the electrical specifications of the power semiconductor chips 120, 140 may be very similar. Further, the power semiconductor chips 120, 140 can be picked-up directly after cutting from the same wafer and assembled in the same die bonder equipment, leading to a further reduction in the manufacturing cost of the power device package 100.

The power device package 100 may include an encapsulant 192. FIGS. 1 and 2 illustrate a possible outline of the encapsulant 192 by a dashed line. For example, a molding process may be carried out to encapsulate the power transistor chips 120, 140.

As illustrated in FIG. 1, the length of the first wire bond connection 128 is greater than the length of the second wire bond connection 148. By way of example, this difference in length may be caused by package layout constrains. In the example shown, the first power transistor chip 120 and the second power transistor chip 140 are arranged in a row with respect to the longitudinal direction of the power device package 100, while the control package terminal 162 is arranged on a transverse side of the power device package 100.

More specifically, the power device package 100 may be designed such that all package terminals 162, 164 and 166 are arranged on the transverse sides of the package 100. In this and other cases, in particular if the first and second power transistor chips 120, 140 are arranged along the longitudinal direction of the power device package 100, it is inevitable that the first wire bond connection 128 and the second wire bond connection 148 are different in length.

This difference in length may impair the simultaneity in the drive behavior of the first and second power transistor chips 120, 140. Differently stated, the switch-on times of the first and second power transistor chips 120, 140 depend on the characteristics of the wire bond connections 128, 148. If the characteristics of the wire bond connections 128, 148 are not the same for the reason of different lengths, the switch-on time of the first power transistor chip 120 may be different to the switch-on time of the second power transistor chip 140.

According to the disclosure, a cross-sectional area of the first wire bond connection 128 is greater than a cross-sectional area of the second wire bond connection 148. That way, the transient switch-on behavior of the power device package 100 can be improved.

It is to be noted that the cost of a power device package 100 can be reduced by replacing one power transistor chip of e.g. $R_{DS(on)}$=10 mΩ by two (substantially cheaper) power transistor chips of $R_{DS(on)}$=20 mΩ, connected in parallel. Hence, package costs may be reduced by replacing power modules (in which the power transistor chip connectivity is provided by conductive traces on an insulating carrier such as, e.g., a ceramic-based carrier) by discreet component packages in which the number of discreet components (i.e. power transistor chips) is raised while cheaper components of lower performance are used, and in which no insulating carrier with conductive traces is used. This approach, which is followed by the disclosure herein, has, however, the problem that the individual power transistor chips need to be driven as if they were a single high-performing power transistor chip.

In general, the first wire bond connection 128 and/or the second wire bond connection 148 may be formed of a single bond wire or a plurality of bond wires. L1 and R1 denote the inductance and the electrical resistance of the first wire bond connection 128. L2 and R2 denote the inductance and the electrical resistance of the second wire bond connection 148. A bond performance of the first wire bond connection 128 can be written as BP1=L1/R1, while a bond performance of the second wire bond connection 148 can be written as BP2=L2/R2. The bond performance is indicative of the inductive switching delay caused by the respective wire bond connection.

In order to provide for similar inductive switching delays among the power transistor chips 120, 140 of the power device package 100, BP1 should be similar to BP2. For example, the condition |BP1−BP2|≤$C_{BP}$×max(BP1,BP2), with $C_{BP}$=0.25 or 0.20 or 0.15 or 0.1 is met.

Adjusting the bond performance of the first and second wire bond connections 128, 148 can be carried out in various ways. For example, the first and second wire bond connections 128, 148 may be made of different materials and/or may comprise a different number of bond wires and/or may have different cross-sectional areas. As a result of adjusting the bond performance of the first and second wire bond connections 128, 148, a multi-chip power device package which features a one transistor device behavior may be obtained.

For example, the material of the first wire bond connection 128 has a specific electrical resistance ρ1, the material of the second wire bond connection 148 has a specific electrical resistance ρ2, and ρ1<ρ2.

For example, the length of the first wire bond connection 128 is X1 and the cross-sectional area of the first wire bond connection 128 is A1. The length of the second wire bond connection 148 is X2 and the cross-sectional area of the second wire bond connection 148 is A2. The wire bond connections 128, 148 may satisfy the condition |A1/X1−A2/X2|≤$C_D$×max(A1/X1,A2/X2), with $C_D$=0.25 or 0.20 or 0.15 or 0.1.

While in the example of FIG. 1, the first and second wire bond connections 128, 148 each consist of a single bond wire, it is also possible that each of the wire bond connections 128, 148 are made of a plurality of bond wires. The cross-sectional area of a multi-bond wire wire bond connection 128, 148 is the sum of the cross-sectional areas of the individual bond wires belonging to the respective wire bond connection 128, 148.

For example, the following wire bond connections may be used in power device package 100:

First wire bond connection 128: Single bond wire of Al, length X1=14 mm, diameter=100 μm.

Second wire bond connection 148: single bond wire of Al, length X2=7 mm, diameter=75 μm.

Power conductor element 168_1: single bond wire of Al, diameter=500 μm.

Power conductor element 168_2: single bond wire of Al, diameter=500 μm.

Connection between sense electrode 147 and Calvin sense terminal 167: Single bond wire of Al, diameter=75 μm.

In this example, A1/X1=7.9×10$^{-3}$ mm$^2$/14 mm=0.56× 10$^{-3}$ mm and A2/X2=4.4×10$^{-3}$ mm$^2$/7 mm=0.63×10$^{-3}$ mm. On the other hand, if the bond wire of the first wire bond connection 128 would have the same diameter (75 μm) as the bond wire of the second wire bond connection 148, this would result in A1/X1=4.4×10$^{-3}$ mm$^2$/14 mm=0.32×10$^{-3}$ mm, i.e. in a considerably longer switch-on delay for the first power transistor chip 120 than for the second power transistor chip 140. Hence, the example gate wiring provides a gate redistribution structure of similar bond performance among gate connections.

Figure 3:
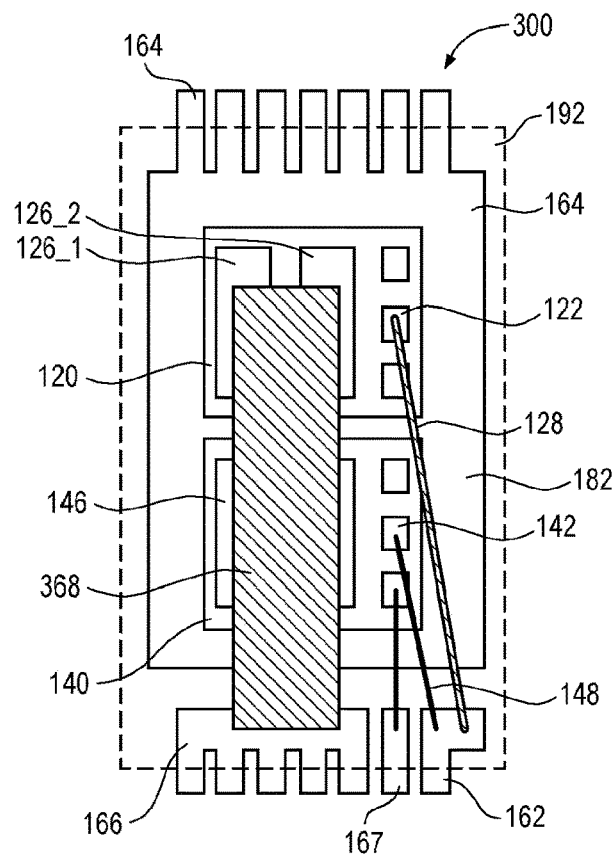
FIG. 3 is a schematic top view of an example of a power device package including two power transistor chips.

FIG. 3 illustrates an example of a power device package 300. The power device package 300 is designed in accordance with the features described for the power device package 100 except that the power conductor 168 of FIGS. 1 and 2 is replaced by a power conductor 368 which is a clip.

For example, the power device package 300 may be implemented with the following electrical connections:

First wire bond connection 128: single bond wire of Cu, length X1=14 mm, diameter=65 μm.

Second wire bond connection 148: single bond wire of Cu, length X2=7 mm, diameter=50 μm.

Power conductor 368: bond clip of Cu, thickness=250 μm.

Connection between sense electrode 147 and Calvin sense terminal 167: Single bond wire of Cu, diameter=50 μm.

Figure 4:
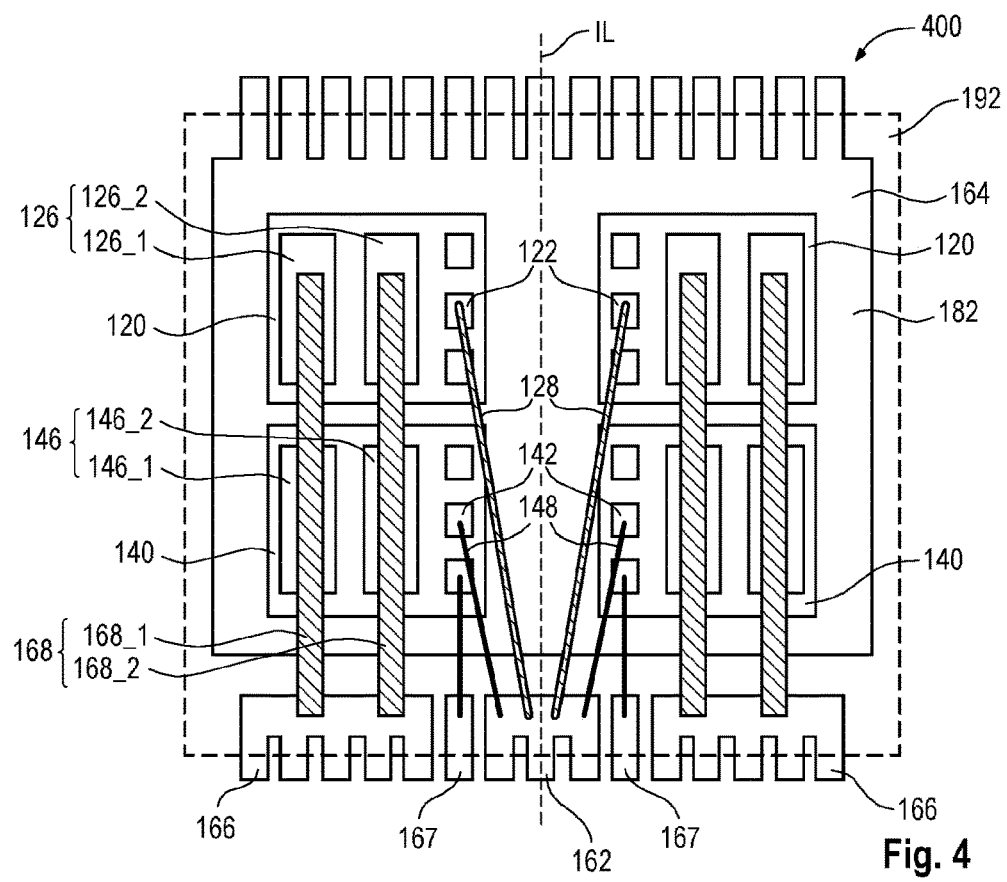
FIG. 4 is a schematic top view of an example of a power device package including four power transistor chips.

Referring to FIG. 4, a power device package 400 may include more than two, e.g., four, power transistor chips 120, 140. The design of power device package 400 may be obtained by mirroring power device package 100 along an imaginary central longitudinal line IL. As illustrated in FIG. 4, all wire bond connections 128, 148 may be connected to the same control package terminal 162. The power device package 400 may have a common first package terminal 164, which is, e.g., formed by a common chip pad 182. As mentioned above, this common chip pad 182 may represent the power drain terminal.

The power device package 400 may include two second package terminals 166, which may represent the power source terminals of the power device package 400. That is, in this example, the left row of power transistor chips 120, 140 and the right row of power transistor chips 120, 140 are connected to a common first package terminal 164 and to separate second package terminals 166. Further, each row of power transistor chips 120, 140 may be assigned to one Calvin sense terminal 167. As to other features of the power device package 400, reference is made to the above disclosure in order to avoid reiteration.

Figure 5:
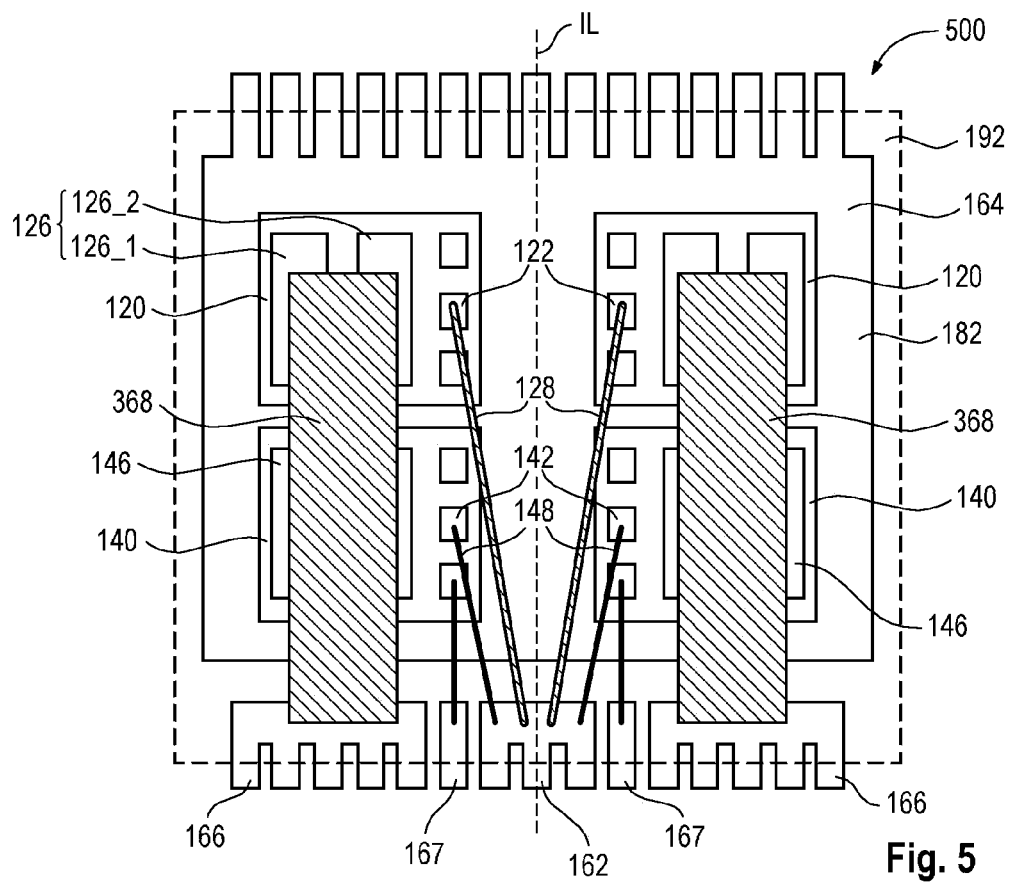
FIG. 5 is a schematic top view of an example of a power device package including four power transistor chips.

Referring to FIG. 5, a power device package 500 may be derived from power device package 300 analogously as described above for power device packages 400 and 100. Reference is made to the above disclosure in order to avoid reiteration.

The concept of implementing e.g. identical power transistor chips 120, 140 into a package can be applied in the transversal direction (compare FIGS. 4 and 5), in the longitudinal direction or in both the transversal and the longitudinal direction. That is, each row of power transistor chips 120, 140 may include two, three, four, five, etc. power transistor chips, and/or a power device package as disclosed herein may include one, two, three, four, five, etc. rows of power transistor chips 120, 140. In this case, a power device package, as disclosed herein, can have further wire bond connections between the control electrodes of the further power transistor chips and the control package terminal 162. The disclosure above, in particular with respect to the dimensioning of such further wire bond connections, will apply analogously to power device packages scaled-up in the longitudinal and/or transversal direction. Based on this disclosure of a multi-chip concept, the related chip-paralleling will be improved due to reduced gate-L/R-wire-differences for each chip.

Figure 6:
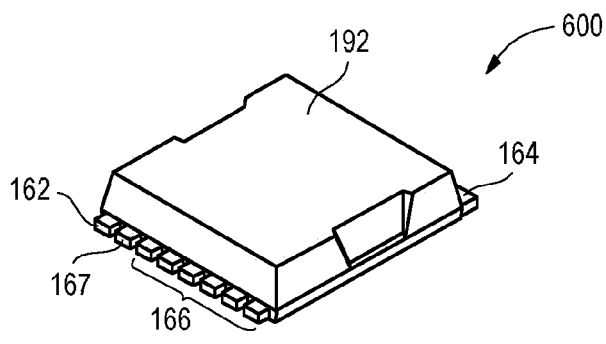
FIG. 6 is a perspective view of the top side of an example of a power device package with encapsulant.
Figure 7:
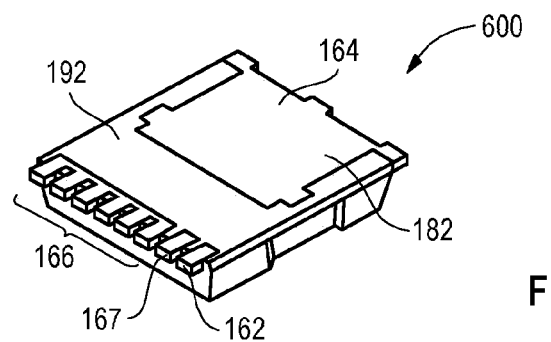
FIG. 7 is a perspective view of the backside of the power device package of FIG. 6.

FIGS. 6 and 7 illustrate an example of a power device package 600. The power device package 600 is a conventional transistor package of Infineon® referred to as TOLL. The power device package 600 is internally designed in accordance with the disclosure.

Figure 8:
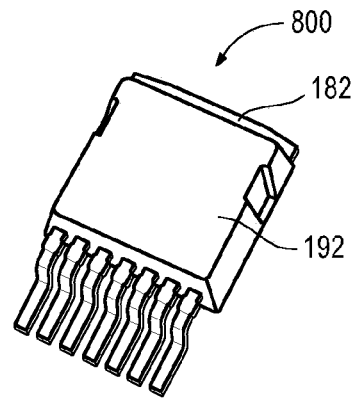
FIG. 8 is a perspective view of the top side of an example of a power device package with encapsulant.
Figure 9:
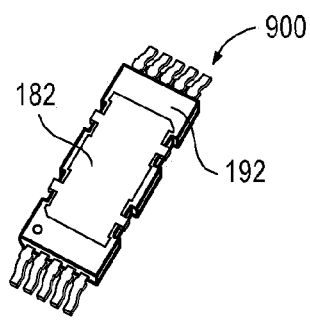
FIG. 9 is a perspective view of the top side of an example of a power device package with encapsulant.
Figure 10:
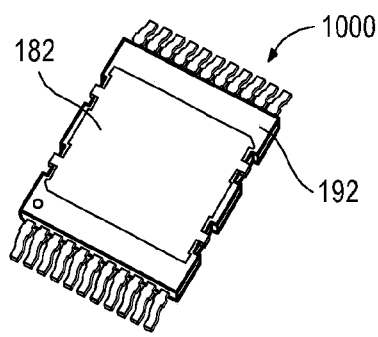
FIG. 10 is a perspective view of the top side of an example of a power device package with encapsulant.
Figure 11:
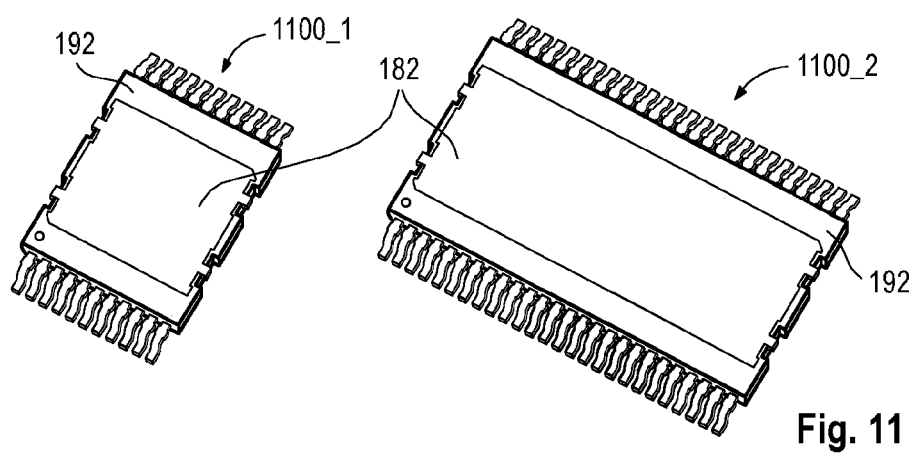
FIG. 11 illustrate perspective views of the top sides of examples of two power device packages with encapsulant.

Other possible power device packages which can be designed in accordance with the disclosure are the transistor packages of Infineon® referred to as DSO, TO263-3/7 (power device package 800 of FIG. 8), DDPAK-TSC (power device package 900 of FIG. 9), QDPAK-TSC (power device package 1000 of FIG. 10), and HexaDPAK-TSC/BSC and OctaDPAK-TSC/BSC (power device packages 1100_1 and 1100_2, respectively, of FIG. 11). For example, the power device packages 400 and 500 of FIGS. 4 and 5 may correspond to the HexaDPAK (30 pins) package 1100_1 of FIG. 11.

The power device packages 100, 300, 400, 500, 600, 800, 900, 1000, 1100_1, 1100_2 disclosed herein may, e.g., be power SMD (Surface-Mounted-Device) packages. Further, power device packages 100, 300, 400, 500, 600, 800, 900, 1000, 1100_1, 1100_2 disclosed herein provide at least one of BSC and/or TSC (Bottom-Side-Cooling/Top-Side-Cooling) capability.

All power device packages 100, 300, 400, 500, 600, 800, 900, 1000, 1100_1, 1100_2 disclosed herein may be configured for switching voltages equal to or greater than 500 V, 600 V, 700 V, or 800 V. Possible applications are half-bridge circuits and/or power factor correction (PFC) circuits.

All power device packages 100, 300, 400, 500, 600, 800, 900, 1000, 1100_1, 1100_2 disclosed herein may be configured for high power applications such as, e.g., main inverter in industrial or automotive applications. For example, such applications may require 100 to 1,000 mm$^2$ chip area with, e.g., a maximum current capacity of 100 to 1,000 A and/or load powers of 100 to 1,000 W.

The following examples pertain to further aspects of the disclosure:

Example 1 is a power device package, comprising: a first power transistor chip having a control electrode, a first load electrode and a second load electrode; a second power transistor chip having a control electrode, a first load electrode and a second load electrode; a control package terminal electrically coupled to the control electrode of the first power transistor chip via a first wire bond connection and to the control electrode of the second power transistor chip via a second wire bond connection; a first package terminal electrically coupled to the first load electrodes of the first power transistor chip and the second power transistor chip; and a second package terminal electrically coupled to one or more of the second load electrodes of the first power transistor chip and/or the second power transistor chip; wherein a length of the first wire bond connection is greater than a length of the second wire bond connection, and a cross-sectional area of the first wire bond connection is greater than a cross-sectional area of the second wire bond connection.

In Example 2, the subject matter of Example 1 can optionally include wherein a bond performance of the first wire bond connection is BP1=L1/R1, with L1 being the inductance of the first wire bond connection and R1 being the electrical resistance of the first wire bond connection, a bond performance of the second wire bond connection is BP2=L2/R2, with L2 being the inductance of the second wire bond connection and R2 being the electrical resistance of the second wire bond connection, and $|BP1-BP2| \le C_{BP} \times \max(BP1,BP2)$, with $C_{BP}$=0.25 or 0.20 or 0.15 or 0.1.

In Example 3, the subject matter of Example 1 or 2 can optionally include wherein the first wire bond connection and/or the second wire bond connection is a single bond wire.

In Example 4, the subject matter of Example 1 or 2 can optionally include wherein the first wire bond connection comprises a first number of bond wires, the second wire bond connection comprises a second number of bond wires, and the first number is greater than the second number.

In Example 5, the subject matter of any preceding Example can optionally include wherein the first power transistor chip and the second power transistor chip have same specifications.

In Example 6, the subject matter of any preceding Example can optionally include wherein the first power transistor chip and the second power transistor chip are from the same wafer.

In Example 7, the subject matter of any preceding Example can optionally include wherein a material of the first wire bond connection is different from a material of the second wire bond connection.

In Example 8, the subject matter of any preceding Example can optionally include wherein the material of the first wire bond connection has a specific electrical resistance $\rho 1$, the material of the second wire bond connection has a specific electrical resistance $\rho 2$, and $\rho 1 < \rho 2$.

In Example 9, the subject matter of any preceding Example can optionally include wherein the length of the first wire bond connection is X1 and the cross-sectional area of the first wire bond connection is A1; the length of the second wire bond connection is X2 and the cross-sectional area of the second wire bond connection is A2; and $|A1/X1 - A2/X2| \le C_D \times \max(A1/X1, A2/X2)$, with $C_D$=0.25 or 0.20 or 0.15 or 0.1.

In Example 10, the subject matter of any preceding Example can optionally further include a leadframe, wherein the control package terminal, the first package terminal and the second package terminal are leads of the leadframe.

In Example 11, the subject matter of Example 10 can optionally include wherein the leadframe comprises a common chip pad, the first power transistor chip and the second power transistor chip are mounted on the common chip pad, and the first load electrode of the first power transistor chip and the first load electrode of the second power transistor chip are directly bonded to the common chip pad.

In Example 12, the subject matter of any preceding Example can optionally include wherein the first power transistor chip and the second power transistor chip are MOSFETs or IGBTs.

In Example 13, the subject matter of any of Example 12 can optionally include wherein the first power transistor chip and the second power transistor chip are superjunction Si MOSFETs or SiC MOSFETs.

In Example 14, the subject matter of any preceding Example can optionally include wherein the power device package is a high voltage package configured for switching voltages equal to or greater than 500 V, 600 V, 700 V, or 800 V.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power device package, comprising:
   a first power transistor chip having a control electrode, a first load electrode and a second load electrode;
   a second power transistor chip having a control electrode, a first load electrode and a second load electrode;
   a control package terminal electrically coupled to the control electrode of the first power transistor chip via a first wire bond connection and to the control electrode of the second power transistor chip via a second wire bond connection;
   a first package terminal electrically coupled to the first load electrode of the first power transistor chip and to the first load electrode of the second power transistor chip; and
   a second package terminal electrically coupled to the second load electrode of the first power transistor chip and/or the second load electrode of the second power transistor chip,
   wherein a length of the first wire bond connection is greater than a length of the second wire bond connection,
   wherein a cross-sectional area of the first wire bond connection is greater than a cross-sectional area of the second wire bond connection.

2. The power device package of claim 1, wherein:
   a bond performance of the first wire bond connection is $BP1=L1/R1$, where L1 is the inductance of the first wire bond connection and R1 is the electrical resistance of the first wire bond connection;
   a bond performance of the second wire bond connection is $BP2=L2/R2$, where L2 is the inductance of the second wire bond connection and R2 is the electrical resistance of the second wire bond connection; and
   $|BP1-BP2| \leq C_{BP} \times \max(BP1,BP2)$, where $C_{BP}=0.25$ or 0.20 or 0.15 or 0.1.

3. The power device package of claim 1, wherein the first wire bond connection and/or the second wire bond connection is a single bond wire.

4. The power device package of claim 1, wherein the first wire bond connection comprises a first number of bond wires, the second wire bond connection comprises a second number of bond wires, and the first number is greater than the second number.

5. The power device package of claim 1, wherein the first power transistor chip and the second power transistor chip have same specifications.

6. The power device package of claim 1, wherein the first power transistor chip and the second power transistor chip are from the same wafer.

7. The power device package of claim 1, wherein a material of the first wire bond connection is different from a material of the second wire bond connection.

8. The power device package of claim 7, wherein:
   the material of the first wire bond connection has a specific electrical resistance $\rho 1$;
   the material of the second wire bond connection has a specific electrical resistance $\rho 2$; and
   $\rho 1 < \rho 2$.

9. The power device package of claim 1, wherein:
   the length of the first wire bond connection is X1 and the cross-sectional area of the first wire bond connection is A1;
   the length of the second wire bond connection is X2 and the cross-sectional area of the second wire bond connection is A2; and
   $|A1/X1 - A2/X2| \leq C_D \times \max(A1/X1, A2/X2)$, where $C_D=0.25$ or 0.20 or 0.15 or 0.1.

10. The power device package of claim 1, further comprising:
    a leadframe,
    wherein the control package terminal, the first package terminal and the second package terminal are leads of the leadframe.

11. The power device package of claim 10, wherein:
    the leadframe comprises a common chip pad;
    the first power transistor chip and the second power transistor chip are mounted on the common chip pad; and
    the first load electrode of the first power transistor chip and the first load electrode of the second power transistor chip are directly bonded to the common chip pad.

12. The power device package of claim 1, wherein the first power transistor chip and the second power transistor chip are MOSFETs or IGBTs.

13. The power device package of claim 12, wherein the first power transistor chip and the second power transistor chip are superjunction Si MOSFETs or SiC MOSFETs.

14. The power device package of claim 1, wherein the power device package is a high voltage package configured for switching voltages equal to or greater than 500 V, 600 V, 700 V, or 800 V.

* * * * *